(12) United States Patent
Chu et al.

(10) Patent No.: US 10,613,592 B1
(45) Date of Patent: Apr. 7, 2020

(54) BENDABLE DEVICE

(71) Applicants: Inventec (Pudong) Technology Corporation, Shanghai (CN); INVENTEC CORPORATION, Taipei (TW)

(72) Inventors: Pin-Chang Chu, Taipei (TW); Chin-Yao Hsu, Taipei (TW); Chia-Chen Chen, Taipei (TW); Cheng-Tai Ho, Taipei (TW)

(73) Assignees: Inventec (Pudong) Technology Corporation, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 16/217,015

(22) Filed: Dec. 11, 2018

(30) Foreign Application Priority Data

Nov. 21, 2018 (CN) .......................... 2018 1 1393030

(51) Int. Cl.
| | |
|---|---|
| *H05K 5/00* | (2006.01) |
| *H05K 7/00* | (2006.01) |
| *G06F 1/16* | (2006.01) |
| *H05K 5/02* | (2006.01) |

(52) U.S. Cl.
CPC ......... *G06F 1/1675* (2013.01); *H05K 5/0226* (2013.01)

(58) Field of Classification Search
CPC ...................................................... H05K 5/00
See application file for complete search history.

(56) References Cited

U.S. PATENT DOCUMENTS

| | | | | |
|---|---|---|---|---|
| 2014/0123436 | A1* | 5/2014 | Griffin ................ | H04M 1/0216 16/221 |
| 2015/0131222 | A1* | 5/2015 | Kauhaniemi ......... | G06F 1/1652 361/679.27 |

* cited by examiner

*Primary Examiner* — Jerry Wu
(74) *Attorney, Agent, or Firm* — CKC & Partners Co., LLC

(57) ABSTRACT

A bendable device includes a base housing, a first housing, a second housing, a third housing, and a plurality of first resilient members. The base housing has two sides that are symmetrical to each other. The first housing is pivotally connected to one of the two sides of the base housing by a first pivot. The second housing is pivotally connected to the base housing and the first housing by the first pivot. The third housing is pivotally connected to the base housing, the first and second housings by the first pivot. The first resilient members are pivotally connected to any adjacent two of the base housing, the first, second, and third housings respectively. The first, second, and third housings rotate about the first pivot relative to the base housing to have the bendable device into a folded state or an expanded state selectively.

10 Claims, 8 Drawing Sheets

BENDABLE DEVICE

CROSS-REFERENCE TO RELATED APPLICATION

This application claims priority to China Application Serial Number 201811393030.8, filed Nov. 21, 2018, the disclosures of which are incorporated herein by reference in their entireties.

BACKGROUND

Field of Invention

The present invention relates to a bendable device. More particularly, the present invention relates to a bendable device with multi-layer housings that are unfolded evenly.

Description of Related Art

With the rapid development of technology, an electronic device with a bendable screen has become a trend in the near future. Therefore, a linkage structure, such as a hinge, and a rotating shaft, is added to the housing of the electronic device. The linkage structure plays as a movable joint so that the electronic device with the bendable screen can be selectively brought into a folded state or an expanded state.

However, when the electronic device with the bendable screen is in the folded state, there is a difference between the inner and outer circumferences at a bending portion of the electronic device since the electronic device has a thickness. The difference between the inner and outer circumferences at the bending portion of the electronic device deteriorates the linkage effect of the linkage structure. Therefore, the linkage structure matching the difference between the inner and outer circumferences of the electronic device must be specially designed.

SUMMARY

The invention provides a bendable device that is able to match the difference between the inner and outer circumferences of a bend of an electronic device, and effectively achieves a good linkage effect.

According to an embodiment of the disclosure, the bendable device includes a base housing, a first housing, a second housing, a third housing, and a plurality of first resilient members. The base housing has two sides that are symmetrical to each other. The first housing is pivotally connected to one of the two sides of the base housing by a first pivot. The second housing is pivotally connected to the base housing and the first housing by the first pivot. The third housing is pivotally connected to the base housing, the first and second housings by the first pivot. The first resilient members are respectively located between any adjacent two of the base housing, the first, second, and third housings. Two ends of each of the first resilient members are pivotally connected to any adjacent two of the base, first, second, and third housings respectively. The first, second, and third housings rotate about the first pivot relative to the base housing to have the bendable device into a folded state or an expanded state selectively. When the bendable device is in the folded state, the first, second, and third housings are sequentially stacked over one of the two sides of the base housing, such that a surface of the third housing and a surface of the base housing together form a flush outer surface.

In an embodiment of the disclosure, the bendable device further includes a fourth housing, a fifth housing, a sixth housing, and a plurality of second resilient members. The fourth housing is pivotally connected to the third housing by a second pivot. The fifth housing is pivotally connected to the third and fourth housings by the second pivot. The sixth housing is pivotally connected to the third, fourth, and fifth housings by the second pivot. The second resilient members are respectively located between any adjacent two of the third, fourth, fifth, and sixth housings. Two ends of each of the second resilient members are pivotally connected to any adjacent two of the third, fourth, fifth, and sixth housings respectively.

In an embodiment of the disclosure, the third housing includes a cover portion, an attachment portion, and a connected portion. The attachment portion is adjacent to the cover portion. A height of the cover portion is greater than a height of the attachment portion. The connected portion is connected between the cover portion and the attachment portion. The connected portion is arranged perpendicular to the cover portion and the attachment portion.

In an embodiment of the disclosure, the bendable device further includes a fourth housing, a fifth housing, and a sixth housing. The fourth, fifth, and sixth housings are pivotally connected to the other one of the two sides of the base housing by a second pivot. The fourth, fifth, and sixth housings are symmetrical to the first, second, and third housings respectively.

In an embodiment of the disclosure, when the bendable device is in the expanded state, joints by which the first resilient members are pivotally connected to the base housing, the first housing, the second housing, and the third housing collectively define an arc.

In an embodiment of the disclosure, the first resilient members have same shape.

In an embodiment of the disclosure, the first resilient members are U-shaped structures. The first pivot is located in recesses of the U-shaped structures of the first resilient members.

In an embodiment of the disclosure, the first resilient members have same modulus of elasticity.

In an embodiment of the disclosure, each of the first, the second, and the third housings includes metal materials.

In embodiment of the disclosure, the base housing includes a main portion and two side portions. The two side portions are respectively connected to two sides of the main portion. A top surface of the main portion and top surfaces of the two side portions form a stepped structure together.

Accordingly, in the bendable device of the present disclosure, the bendable device is provided with a plurality of the same resilient members disposed between any adjacent two of the base housing, the first, second, and third housings. As such, each of the housings and the base housing of the bendable device together form an arc with the difference between inner and outer circumferences when the bendable device is in the expanded state. The good linkage effect between each of the housings and the base housing is achieved also. Moreover, when the bendable device is in the expanded state, each of the housings of the bendable device can be unfolded evenly relative to the base housing since each of the resilient members has the same modulus of elasticity. In this way, the bendable device has an aesthetic appearance at the same time of achieving the good linkage effect.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
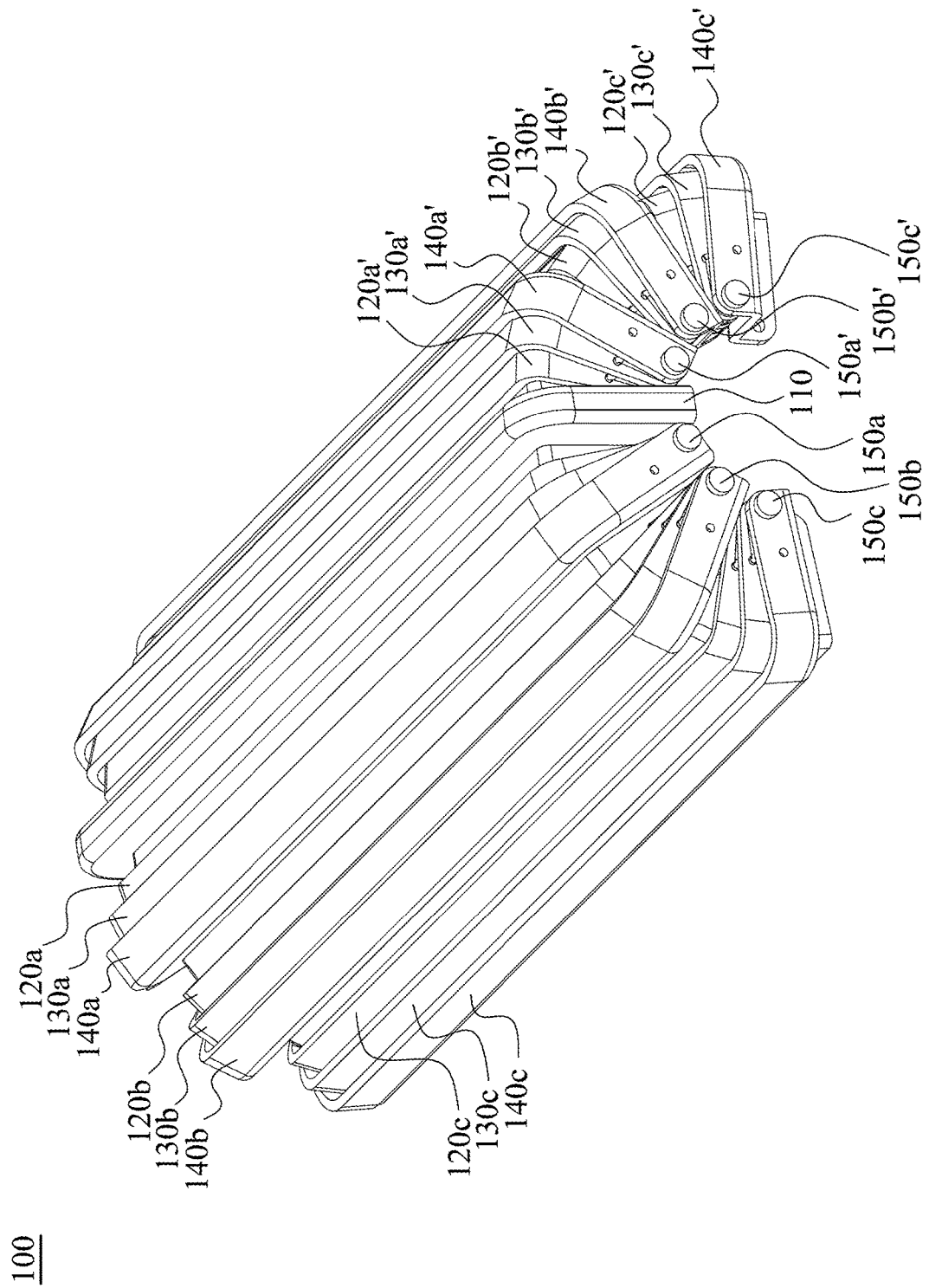
FIG. 1 is a perspective view of a bendable device in an expanded state according to an embodiment of the disclosure.

Reference will now be made in detail to the present embodiments of the invention, examples of which are illustrated in the accompanying drawings. Wherever possible, the same reference numbers are used in the drawings and the description to refer to the same or like parts.

Figure 2:
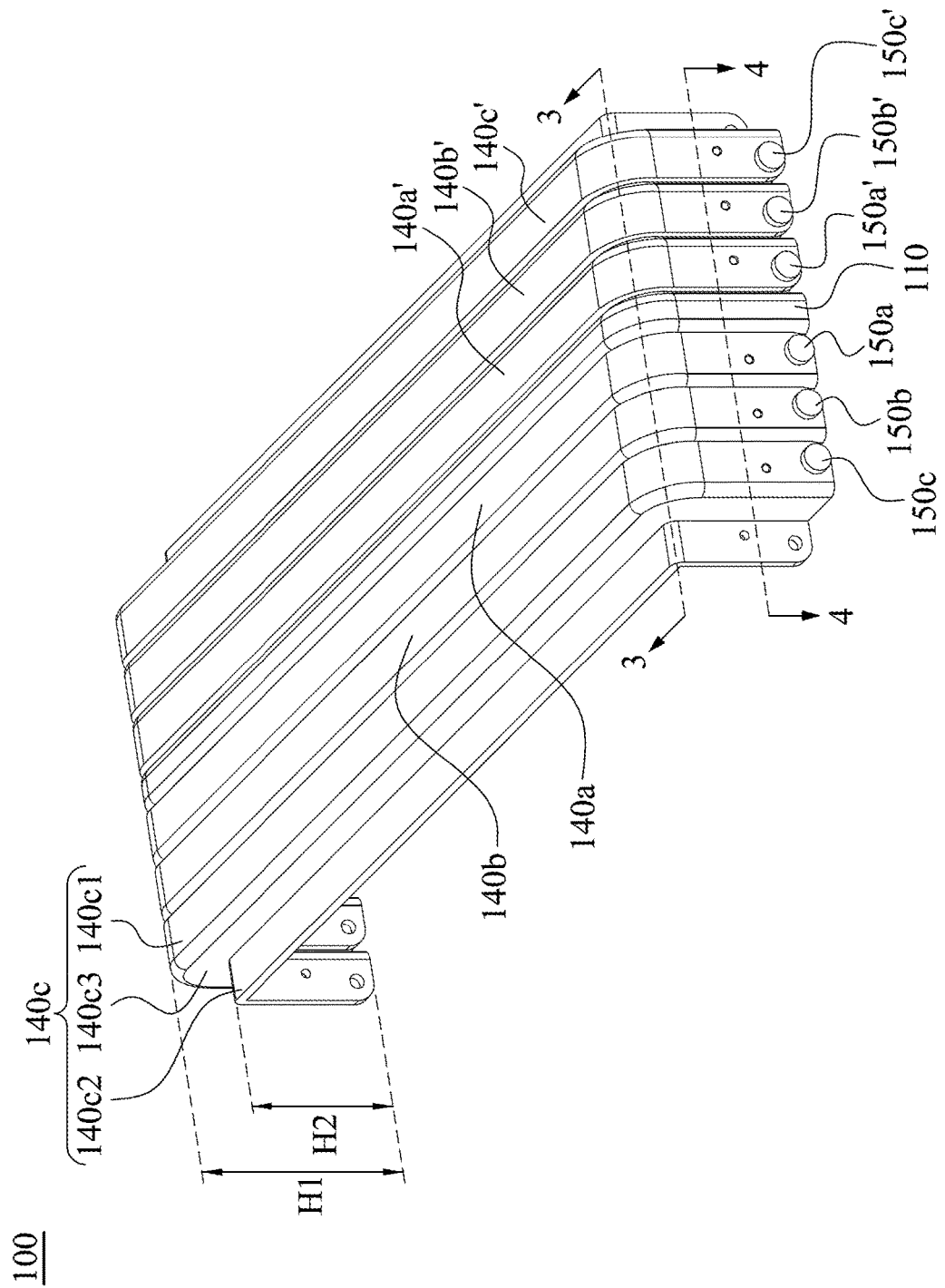
FIG. 2 is a perspective view of the bendable device in a folded state according to an embodiment of the disclosure.

Reference is made to FIGS. 1 and 2. FIG. 1 is a perspective view of a bendable device 100 in an expanded state according to an embodiment of the disclosure. FIG. 2 is a perspective view of the bendable device 100 in a folded state according to an embodiment of the disclosure.

In the embodiment, the bendable device 100 is a linkage structure mounted at a bending portion of an electronic device with a bendable screen. The bendable device 100 is used for having the bendable electronic device into a folded state or an expanded state. The electronic device can be a mobile phone or a tablet, but the disclosure is not limited in this regard. The bendable device 100 includes a base housing 110, a plurality of housings 120a, 130a, 140a, 120b, 130b, 140b, 120c, 130c, 140c, 120a', 130a', 140a', 120b', 130b', 140b', 120c', 130c', and 140c', and a plurality of pivots 150a, 150b, 150c, 150a', 150b', and 150c'. The base housing 110 has two sides. The two sides are symmetrical to each other. The housing 120a, the housing 130a, the housing 140a, the housing 120b, the housing 130b, the housing 140b, the housing 120c, the housing 130c, the housing 140c, the pivot 150a, the pivot 150b, and the pivot 150c are disposed on one side of the base housing 110. The housing 120a', the housing 130a', the housing 140a', the housing 120b', the housing 130b', the housing 140b', the housing 120c', the housing 130c', the housing 140c', the pivot 150a', the pivot 150b', and the pivot 150c' are disposed on the other side of the base housing 110 and are respectively symmetrical to the housing 120a, the housing 130a, the housing 140a, the housing 120b, the housing 130b, the housing 140b, the housing 120c, the housing 130c, the housing 140c, the pivot 150a, the pivot 150b, and the pivot 150c.

For convenience of the following introduction, the housing 120a, the housing 130a, the housing 140a, the housing 120b, the housing 130b, the housing 140b, the housing 120c, the housing 130c, the housing 140c, the pivot 150a, the pivot 150b, and the pivot 150c are exemplarily described in the following. The introduction of the housing 120a', the housing 130a', the housing 140a', the housing 120b', the housing 130b', the housing 140b', the housing 120c', the housing 130c', the housing 140c', the pivot 150a', the pivot 150b', and the pivot 150c' can refer to the descriptions of the housing 120a, the housing 130a, the housing 140a, the housing 120b, the housing 130b, the housing 140b, the housing 120c, the housing 130c, the housing 140c, the pivot 150a, the pivot 150b, and the pivot 150c and therefore are not repeated in the following.

The housing 120a, the housing 130a, and the housing 140a are pivotally connected to the side of the base housing 110 by the pivot 150a. Similarly, the housing 120b, the housing 130b, and the housing 140b are pivotally connected to the housing 140a by the pivot 150b. The housing 120c, the housing 130c, and the housing 140c are pivotally connected to the housing 140b by the pivot 150c. The housing 120a, the housing 130a, and the housing 140a rotate about the pivot 150a relative to the base housing 110. The housing 120b, the housing 130b, and the housing 140b rotate about the pivot 150b relative to the base housing 110 and the housing 140a. The housing 120c, the housing 130c, and the housing 140c rotate about the pivot 150c relative to the base housing 110, the housing 140a, and the housing 140b. As such, the bendable device 100 is selectively placed in the expanded state as shown in FIG. 1 or in the folded state as shown in FIG. 2.

Substantially, the housing 120a, the housing 120b, the housing 120c, the housing 120a', the housing 120b', and the housing 120c' have same structure. The housing 130a, the housing 130b, the housing 130c, the housing 130a', the housing 130b', and the housing 130c' have same structure. The housing 140a, the housing 140b, the housing 140c, the housing 140a', the housing 140b', and the housing 140c' have same structure. Therefore, the housing 120a, the housing 130a, the housing 140a, the housing 120b, the housing 130b, the housing 140b, the housing 120c, the housing 130c, and the housing 140c can be respectively symmetrical to the housing 120a', the housing 130a', the housing 140a', the housing 120b', the housing 130b', the housing 140b', the housing 120c', the housing 130c', and the housing 140c' based on a center of the base housing 110 no matter the bendable device 100 is in the folded state or in the expanded state.

As shown in FIG. 2, the housing 140c includes a cover portion 140c1, an attachment portion 140c2, and a connected portion 140c3. The cover portion 140c1 and the attachment portion 140c2 are U-shaped structure. The cover portion 140c1 is adjacent to the attachment portion 140c2. A height H1 of the cover portion 140c1 is greater than a height H2 of the attachment portion 140c2. The connected portion 140c3 is connected between the cover portion 140c1 and the attachment portion 140c2. The connected portion 140c3 is arranged perpendicular to the cover portion 140c1 and the attachment portion 140c2, such that a top surface of the cover portion 140c1, the connected portion 140c3, and a top surface of the attachment portion 140c2 together form a step structure. The housing 140a, the housing 140b, the housing 140a', the housing 140b', and the housing 140c' have the structure same as the housing 140c. The introduction of structure of each of the housings 140a, 140b, 140a', 140b', and 140c' can refer to the previous descriptions of the housing 140c and therefore are not repeated in the following.

Figure 3:
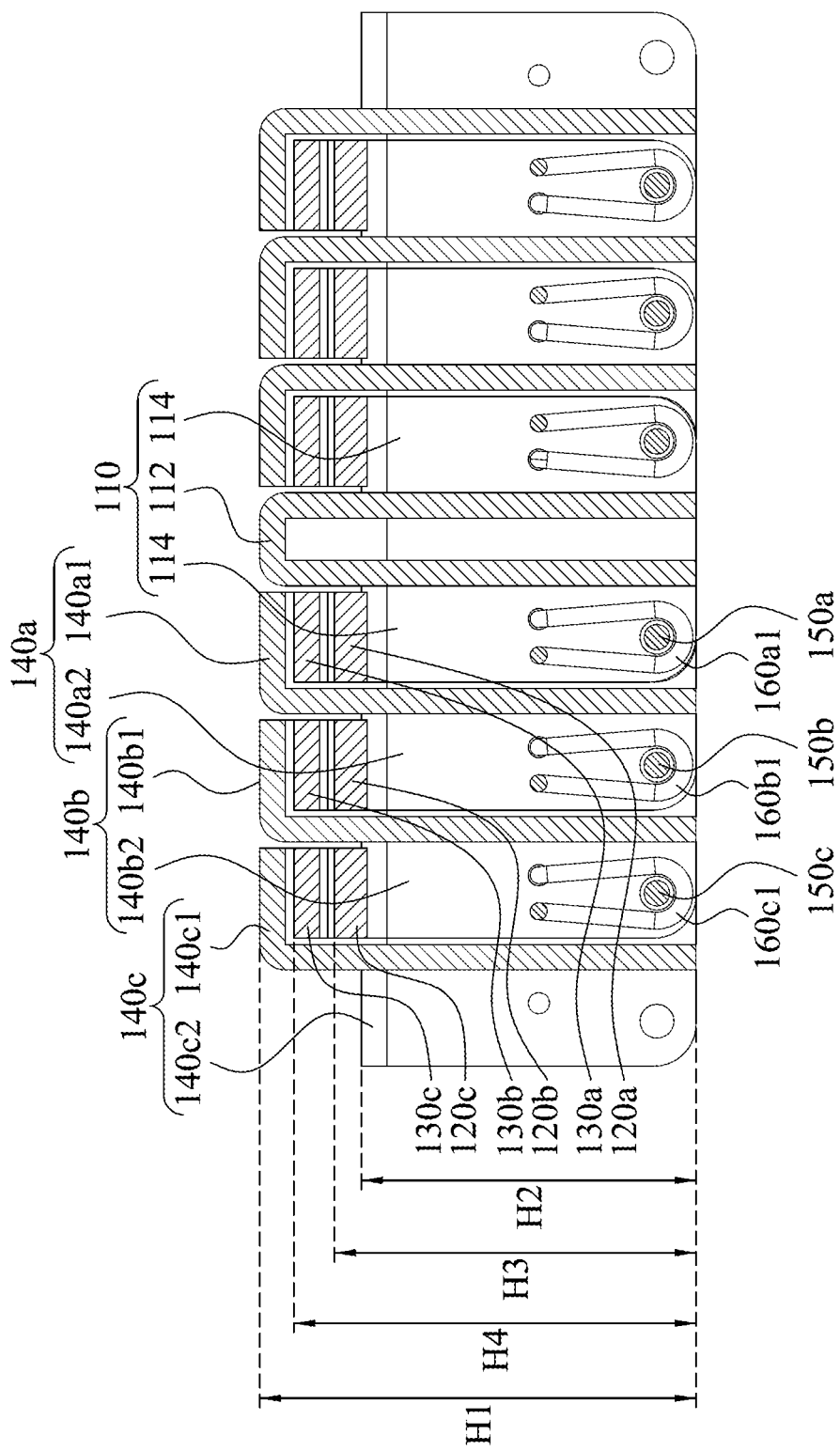
FIG. 3 is a cross-section view of the bendable device taken along line 3-3 in FIG. 2.
Figure 4A:
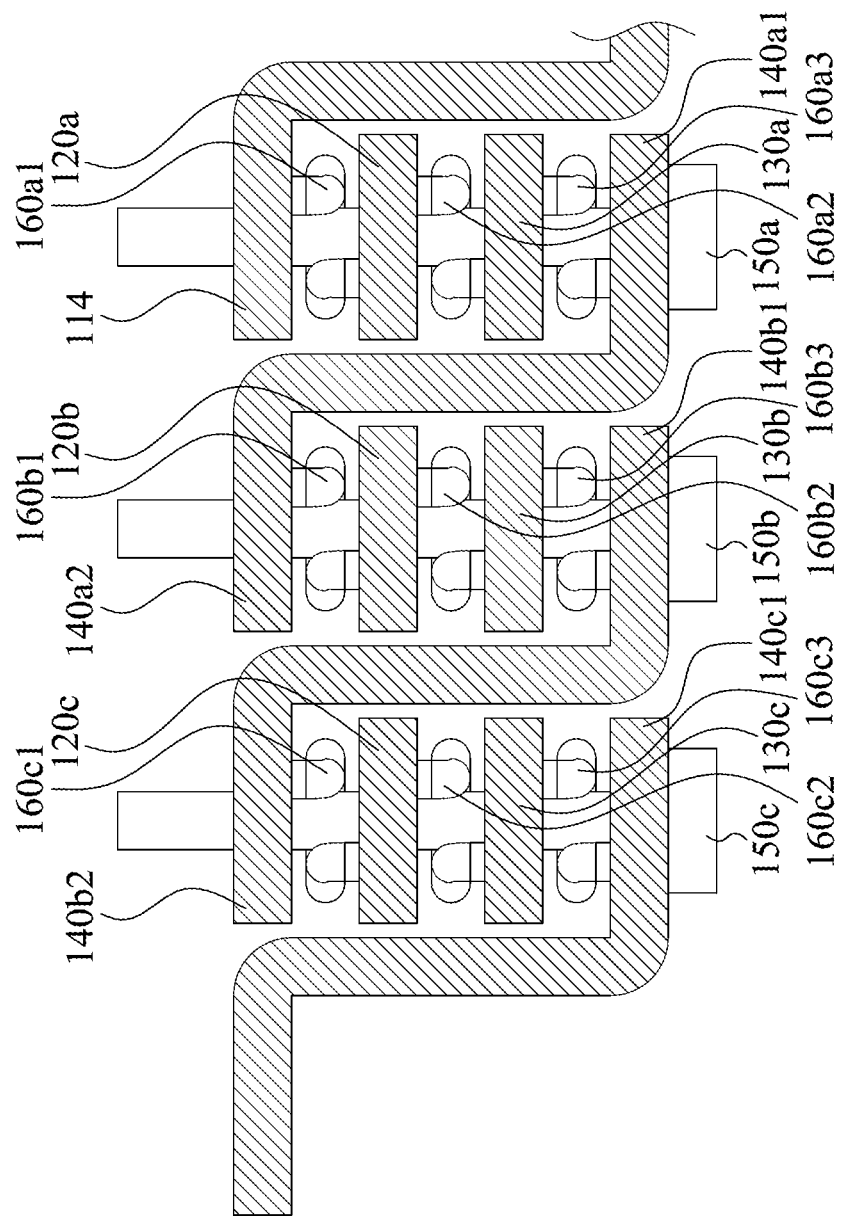
FIG. 4A is a partially cross-section view of the left side of the bendable device taken along line 4-4 in FIG. 2.
Figure 4B:
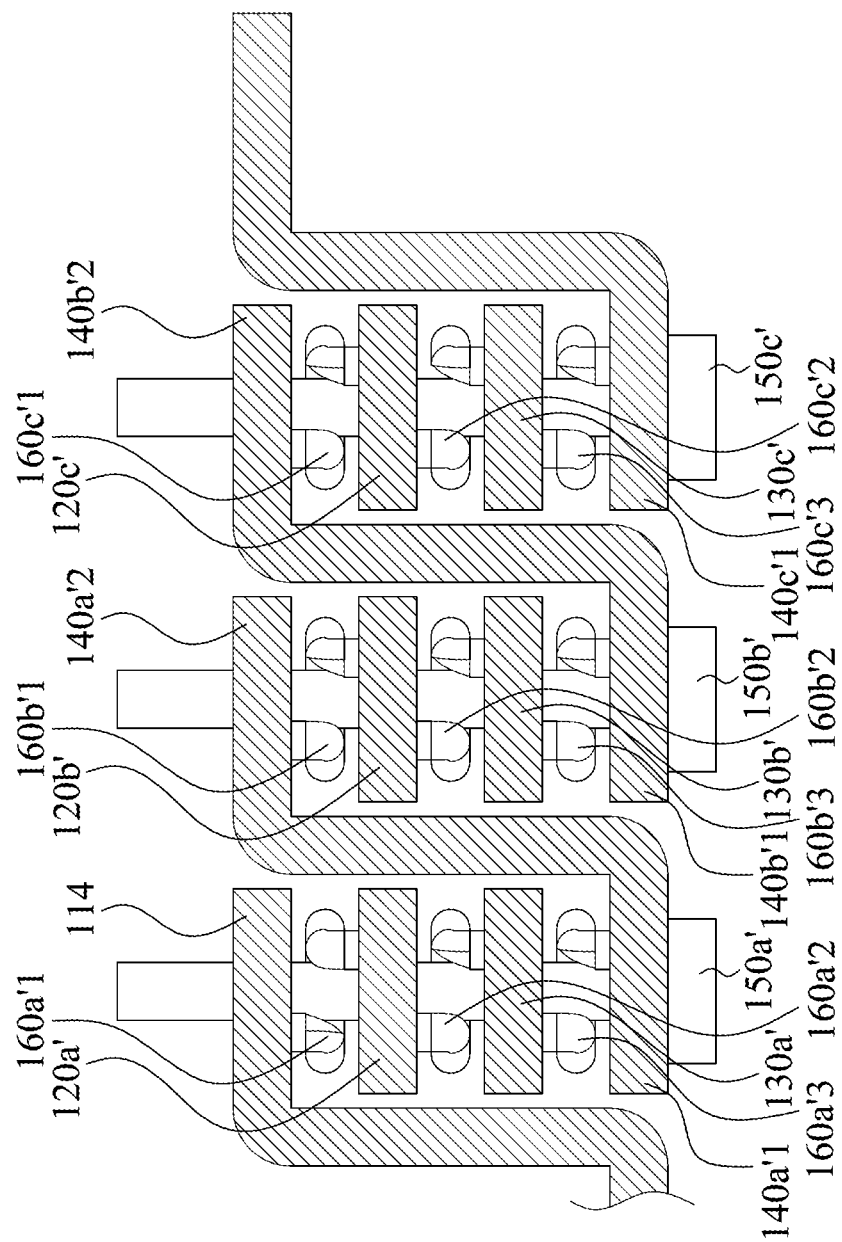
FIG. 4B is a partially cross-section view of the right side of the bendable device taken along line 4-4 in FIG. 2.
Figure 5:
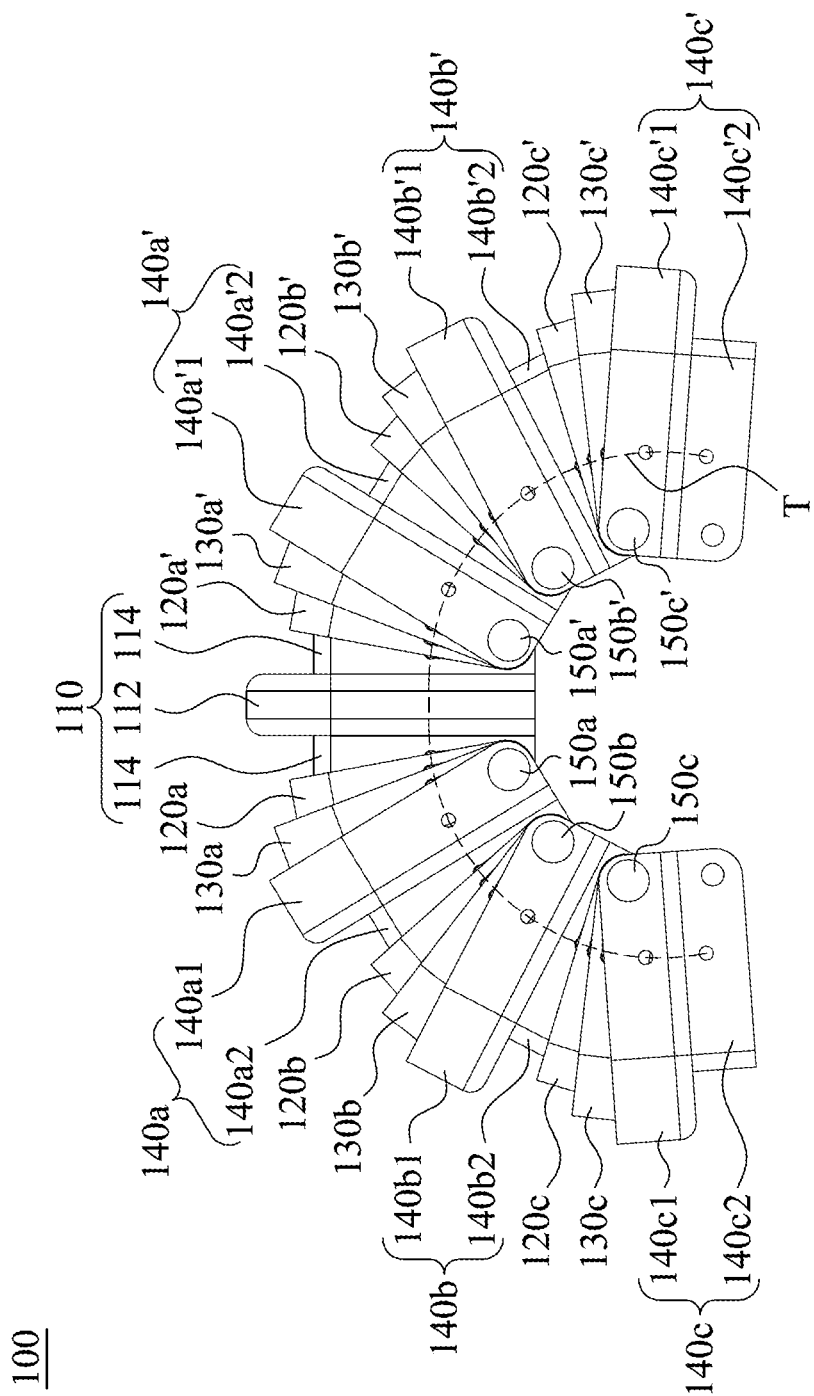
FIG. 5 is a front view of the bendable device in FIG. 1.

Reference is made to FIGS. 3, 4A, 4B and 5. FIG. 3 is a cross-section view of the bendable device 100 taken along line 3-3 in FIG. 2. FIG. 4A is a partially cross-section view of the left side of the bendable device 100 taken along line 4-4 in FIG. 2. FIG. 4B is a partially cross-section view of the right side of the bendable device 100 taken along line 4-4 in FIG. 2. FIG. 5 is a front view of the bendable device 100 in FIG. 1.

In the embodiment, the base housing 110 includes a main portion 112 and two side portions 114. The two side portions 114 are respectively connected to two sides of the main portion 112. The two side portions 114 are symmetrical to each other based on a center of the main portion 112. A height of the main portion 112 is the same as the height H1 of the cover portion 140c1 of the housing 140c. Heights of the two side portions 114 are the same as the height H2 of the attachment portion 140c2 of the housing 140c. In other words, a top surface of the main portion 112 and a top surface of one side portion 114 form a stepped structure. A top surface of the other side portion 114 and the top surface of the main portion 112 form a stepped structure also. The above two stepped structures are symmetrical to each other based on the center of the main portion 112.

Each of the housings 120a, 120b, 120c, 130a, 130b, and 130c has U-shaped structure. Each of the housings 120a, 120b, and 120c has a height H3 and the heights H3 of the housing 120a, the housing 120b, and the housing 120c respectively are the same. Each of the housings 130a, 130b, and 130c has a height H4 and the heights H4 of the housing 130a, the housing 130b, and the housing 130c respectively are the same. Therefore, when the bendable device 100 is in the folded state, the housing 120a covers above one of the two side portions 114 of the base housing 110, the housing 130a covers above the housing 120a, and the cover portion 140a1 of the housing 140a covers above the housing 130a, such that the housing 120a, the housing 130a, and the cover portion 140a1 of the housing 140a are sequentially stacked over the side portion 114.

Furthermore, the attachment portion 140a2 of the housing 140a extends to an underneath of the adjacent housing 120b. The housing 120b, the housing 130b, the cover portion 140b1 of the housing 140b are sequentially stacked over the attachment portion 140a2 of the housing 140a. Similarly, the attachment portion 140b2 of the housing 140b extends to an underneath of the adjacent housing 120c. As such, the housing 120c, the housing 130c, the cover portion 140c1 of the housing 140c are sequentially stacked over the attachment portion 140b2 of the housing 140b.

The housing 120a', the housing 130a', the housing 140a', the housing 120b', the housing 130b', the housing 140b', the housing 120c', the housing 130c', and the housing 140c' are disposed on the other side of the base housing 110. The housing 120a', the housing 130a', the housing 140a', the housing 120b', the housing 130b', the housing 140b', the housing 120c', the housing 130c', and the housing 140c' are respectively symmetrical to the housing 120a, the housing 130a, the housing 140a, the housing 120b, the housing 130b, the housing 140b, the housing 120c, the housing 130c, and the housing 140c. The introduction of the housing 120a', the housing 130a', the housing 140a', the housing 120b', the housing 130b', the housing 140b', the housing 120c', the housing 130c', and the housing 140c' can refer to the previous descriptions of the housing 120a, the housing 130a, the housing 140a, the housing 120b, the housing 130b, the housing 140b, the housing 120c, the housing 130c, and the housing 140c and therefore are not repeated here.

With the above configuration of the bendable device 100, when the bendable device 100 is in the folded state, an outer surface of the main portion 112 of the base housing 110 and an outer surface of each of the housings 140a, 140b, 140c, 140a', 140b', and 140c' form a flush outer surface together. In addition, a top surface of each of the housings 140a, 140b, 140c, 140a', 140b', and 140c' has a linear structure. As such, when the electronic device with bendable screen is in the expanded state, the bendable device 100 and the housing of the electronic device together form a flat appearance to achieve an aesthetic effect.

As shown in FIGS. 4A and 4B, the bendable device 100 further includes a plurality of resilient members 160a1, 160a2, 160a3, 160b1, 160b2, 160b3, 160c1, 160c2, 160c3, 160a'1, 160a'2, 160a'3, 160b'1, 160b'2, 160b'3, 160c'1, 160c'2, 160c'3. Each of the resilient members 160a1, 160a2, 160a3, 160b1, 160b2, 160b3, 160c1, 160c2, 160c3, 160a'1, 160a'2, 160a'3, 160b'1, 160b'2, 160b'3, 160c'1, 160c'2, 160c'3 has the same U-shaped structure and the modulus of elasticity, but the disclosure is not limited in this regard. The resilient member 160a1, the resilient member 160a2, the resilient member 160a3, the resilient member 160b1, the resilient member 160b2, the resilient member 160b3, the resilient member 160c1, the resilient member 160c2, and the resilient member 160c3 are disposed on one side of the base housing 110. The resilient member 160a'1, the resilient member 160a'2, the resilient member 160a'3, the resilient member 160b'1, the resilient member 160b'2, the resilient member 160b'3, the resilient member 160c'1, the resilient member 160c'2, and the resilient member 160c'3 are disposed on the other side of the base housing 110. The resilient member 160a1, the resilient member 160a2, the resilient member 160a3, the resilient member 160b1, the resilient member 160b2, the resilient member 160b3, the resilient member 160c1, the resilient member 160c2, and the resilient member 160c3 are respectively symmetrical to the resilient member 160a'1, the resilient member 160a'2, the resilient member 160a'3, the resilient member 160b'1, the resilient member 160b'2, the resilient member 160b'3, the resilient member 160c'1, the resilient member 160c'2, and the resilient member 160c'3.

For convenience of the following introduction, the resilient member 160a1, the resilient member 160a2, the resilient member 160a3, the resilient member 160b1, the resilient member 160b2, the resilient member 160b3, the resilient member 160c1, the resilient member 160c2, and the resilient member 160c3 are exemplarily described in the following. The introduction of the resilient member 160a'1, the resilient member 160a'2, the resilient member 160a'3, the resilient member 160b'1, the resilient member 160b'2, the resilient member 160b'3, the resilient member 160c'1, the resilient member 160c'2, and the resilient member 160c'3 can refer to the descriptions of the resilient member 160a1, the resilient member 160a2, the resilient member 160a3, the resilient member 160b1, the resilient member 160b2, the resilient member 160b3, the resilient member 160c1, the resilient member 160c2, and the resilient member 160c3 and therefore are not repeated in the following.

Two ends of the resilient member 160a1 are pivotally connected to one of the two side portions 114 and the housing 120a respectively, such that the resilient member 160a1 is abutted between the base housing 110 and the housing 120a. Two ends of the resilient member 160a2 are pivotally connected to the housing 130a and the housing 120a respectively, such that the resilient member 160a2 is abutted between the housing 130a and the housing 120a. Two ends of the resilient member 160a3 are pivotally connected to the housing 130a and the cover portion 140a1 of the housing 140a respectively, such that the resilient member 160a3 is abutted between the housing 130a and the housing 140a. Similarly, the resilient member 160b1 is abutted between the attachment portion 140a2 of the housing 140a and the housing 120b. The resilient member 160b2 is abutted between the housing 120b and the housing 130b. The resilient member 160b3 is abutted between the housing 130b and the cover portion 140b1 of the housing 140b. The resilient member 160c1 is abutted between the attachment portion 140b2 of the housing 140b and the housing 120c. The resilient member 160c2 is abutted between the housing 120c and the housing 130c. The resilient member 160c3 is abutted between the housing 130c and the cover portion 140c1 of the housing 140c.

The resilient member 160a'1, the resilient member 160a'2, the resilient member 160a'3, the resilient member 160b'1, the resilient member 160b'2, the resilient member 160b'3, the resilient member 160c'1, the resilient member 160c'2, and the resilient member 160c'3 are respectively symmetrical to the resilient member 160a1, the resilient member 160a2, the resilient member 160a3, the resilient member 160b1, the resilient member 160b2, the resilient member 160b3, the resilient member 160c1, the resilient member 160c2, and the resilient member 160c3. Therefore, the resilient member 160a'1, the resilient member 160a'2, and the resilient member 160a'3 are respectively abutted between adjacent two of the side portion 114, the housing 120a', the housing 130a', and the cover portion 140a'1 of the housing 140a'. The resilient member 160b'1, the resilient member 160b'2, and the resilient member 160b'3 are respectively abutted between adjacent two of the attachment portion 140a'2 of the housing 140a', the housing 120b', the housing 130b', and the cover portion 140b'1 of the housing 140b'. The resilient member 160c'1, the resilient member 160c'2, and the resilient member 160c'3 are respectively abutted between adjacent two of the attachment portion 140b'2 of the housing 140b', the housing 120c', the housing 130c', and the cover portion 140c'1 of the housing 140c'.

The pivot 150a is located in recesses of the U-shaped structures of the resilient member 160a1, the resilient member 160a2, and the resilient member 160a3. The pivot 150a is adjacent to concave portions of the resilient member 160a1, the resilient member 160a2, and the resilient member 160a3, but the disclosure should not be limited in this regard. Similarly, the pivot 150b is located in concave portions of the resilient member 160b1, the resilient member 160b2, and the resilient member 160b3 and the pivot 150b is at the level same as the pivot 150a. The pivot 150c is located in concave portions of the resilient member 160c1, the resilient member 160c2, and the resilient member 160c3 and the pivot 150c is at the level same as the pivot 150a and the pivot 150b. An opening of each of the resilient members 160a1, 160b1, and 160c1 respectively faces a top surface of the housings 120a, 120b, and 120c. Similarly, openings of the resilient member 160a2 and the resilient member 160a3 face the top surface of the housing 120a. Openings of the resilient member 160b2 and the resilient member 160b3 face the top surface of the housing 120b. Openings of the resilient member 160c2 and the resilient member 160c3 face the top surface of the housing 120c.

When the bendable device 100 is in the folded state, the resilient member 160a1 is compressed by the housing 120a and the base housing 110 to store elastic potential energy. When the bendable device 100 is in the expanded state, the stored elastic potential energy enables the two ends of the resilient member 160a1 to be apart from each other. Since one end of the resilient member 160a1 is pivotally connected to the two side portion 114 of the base housing 110 and the other end is pivotally connected to the housing 120a, the resilient member 160a1 is able to drive the side portion 114 to be staggered with the housing 120a. Similarly, the resilient member 160a2 is abutted between the housing 120a and the housing 130a, such that the resilient member 160a2 is compressed by the housing 120a and the housing 130a to store the elastic potential energy. When the bendable device 100 is in the expanded state, the stored elastic potential energy enables the housing 120a to be staggered with the housing 130a. The resilient member 160a3 is abutted between the housing 130a and the housing 140a, such that the resilient member 160a3 is compressed by the housing 130a and the housing 140a to store the elastic potential energy. When the bendable device 100 is in the expanded state, the stored elastic potential energy enables the housing 130a to be staggered with the housing 140a.

With the above configuration of the bendable device 100, as shown in FIG. 5, when the bendable device 100 is in the expanded state, the housing 120a, the housing 130a, and the housing 140a rotate about the pivot 150a relative to the base housing 110 and expand sequentially towards a direction away from the main portion 112 of the base housing 110. Similarly, the housing 120b, the housing 130b, and the housing 140b rotate about the pivot 150b relative to the base housing 110 and the housing 140a, and the housing 120b, the housing 130b, and the housing 140b expand sequentially towards the direction away from the main portion 112 of the base housing 110. The housing 120c, the housing 130c, and the housing 140c rotate about the pivot 150c relative to the base housing 110, the housing 140a, and the housing 140b, and the housing 120c, the housing 130c, and the housing 140c expand sequentially towards the direction away from the main portion 112 of the base housing 110. The housing 120a', the housing 130a', the housing 140a', the housing 120b', the housing 130b', the housing 140b', the housing 120c', the housing 130c', and the housing 140c' sequentially expand at the other side of the base housing 110, and the housing 120a', the housing 130a', the housing 140a', the housing 120b', the housing 130b', the housing 140b', the housing 120c', the housing 130c', and the housing 140c' are respectively symmetrical to the housing 120a, the housing 130a, the housing 140a, the housing 120b, the housing 130b, the housing 140b, the housing 120c, the housing 130c, and the housing 140c, such that joints by which the resilient members 160a1, 160a2, 160a3, 160b1, 160b2, 160b3, 160c1, 160c2, 160c3, 160a'1, 160a'2, 160a'3, 160b'1, 160b'2, 160b'3, 160c'1, 160c'2, and 160c'3 are pivotally connected to the housings 120a, 130a, 140a, 120b, 130b, 140b, 120c, 130c, 140c, 120a', 130a', 140a', 120b', 130b', 140b', 120c', 130c', and 140c' collectively define an arc T.

Moreover, the pivot 150a, the pivot 150b, the pivot 150c, the pivot 150a', the pivot 150b', and the pivot 150c' are disposed at the same level close to the bottom of each of the housings 120a, 130a, 140a, 120b, 130b, 140b, 120c, 130c, 140c, 120a', 130a', 140a', 120b', 130b', 140b', 120c', 130c', and 140c'. Therefore, when the housing 120a, the housing 130a, the housing 140a, the housing 120b, the housing 130b, the housing 140b, the housing 120c, the housing 130c, the housing 140c, the housing 120a', the housing 130a', the housing 140a', the housing 120b', the housing 130b', the housing 140b', the housing 120c', the housing 130c', and the housing 140c' symmetrically expand at the two sides of the base housing 110, the housing 120a, the housing 130a, the housing 140a, the housing 120b, the housing 130b, the housing 140b, the housing 120c, the housing 130c, the housing 140c, the housing 120a', the housing 130a', the housing 140a', the housing 120b', the housing 130b', the housing 140b', the housing 120c', the housing 130c', and the housing 140c' together form the arc structure with a short inner circumference and a long circumference. In addition, with the help of the resilient member 160a1, the resilient member 160a2, the resilient member 160a3, the resilient member 160b1, the resilient member 160b2, the resilient member 160b3, the resilient member 160c1, the resilient member 160c2, the resilient member 160c3, the resilient member 160a'1, the resilient member 160a'2, the resilient member 160a'3, the resilient member 160b'1, the resilient member 160b'2, the resilient member 160b'3, the resilient member 160c'1, the resilient member 160c'2, and the resilient member 160c'3, there is good linkage effect between any adjacent two of the base housing 110, the housing 120a, the housing 130a, the housing 140a, the housing 120b, the housing 130b, the housing 140b, the housing 120c, the housing 130c, the housing 140c, the housing 120a', the housing 130a', the housing 140a', the housing 120b', the housing 130b', the housing 140b', the housing 120c', the housing 130c', and the housing 140c'.

Furthermore, the resilient members 160a1, the resilient member 160a2, the resilient member 160a3, the resilient member 160b1, the resilient member 160b2, the resilient member 160b3, the resilient member 160c1, the resilient member 160c2, the resilient member 160c3, the resilient member 160a'1, the resilient member 160a'2, the resilient member 160a'3, the resilient member 160b'1, the resilient member 160b'2, the resilient member 160b'3, the resilient member 160c'1, the resilient member 160c'2, and the resilient member 160c'3 have the same modulus of elasticity. Thus, each of the resilient members 160a1, 160a2, 160a3, 160b1, 160b2, 160b3, 160c1, 160c2, 160c3, 160a'1, 160a'2, 160a'3, 160b'1, 160b'2, 160b'3, 160c'1, 160c'2, and 160c'3, is able to drive any adjacent two housings 120a, 130a, 140a, 120b, 130b, 140b, 120c, 130c, 140c, 120a', 130a', 140a', 120b', 130b', 140b', 120c', 130c', and 140c' to expand at the same angle, such that the aesthetic appearance of the bendable device 100 is achieved.

In the embodiment, each of the housings 120a, 130a, 140a, 120b, 130b, 140b, 120c, 130c, 140c, 120a', 130a', 140a', 120b', 130b', 140b', 120c', 130c', and 140c' includes hard materials, for example metal materials, but the disclosure is not limited in this regard. The housings 120a, 130a, 140a, 120b, 130b, 140b, 120c, 130c, 140c, 120a', 130a', 140a', 120b', 130b', 140b', 120c', 130c', and 140c' made of the hard materials can enhance the supporting force of the bendable device 100 to avoid the happening of a deformation of the housings 120a, 130a, 140a, 120b, 130b, 140b, 120c, 130c, 140c, 120a', 130a', 140a', 120b', 130b', 140b', 120c', 130c', and 140c' when the bendable device 100 is pressed by an external force. The metallic luster of the metal materials can bring a beautiful appearance to the bendable device 100.

In some embodiments, the number of the stacked layers is not limited in this regard and therefore the number of the stacked layer can be adjusted according to actual operation conditions.

Figure 6:
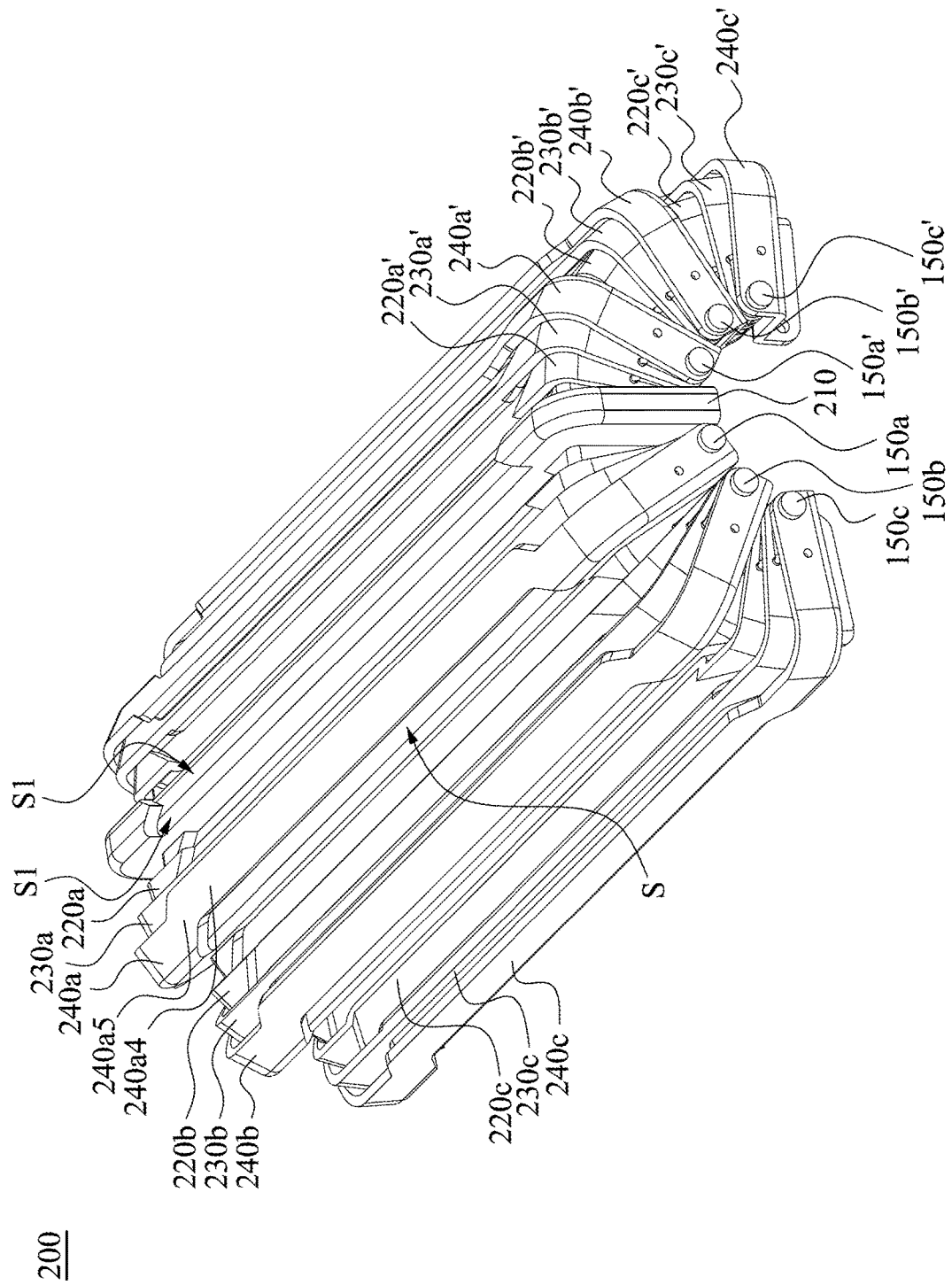
FIG. 6 is a perspective view of a bendable device in an expanded state according to another embodiment of the disclosure.
Figure 7:
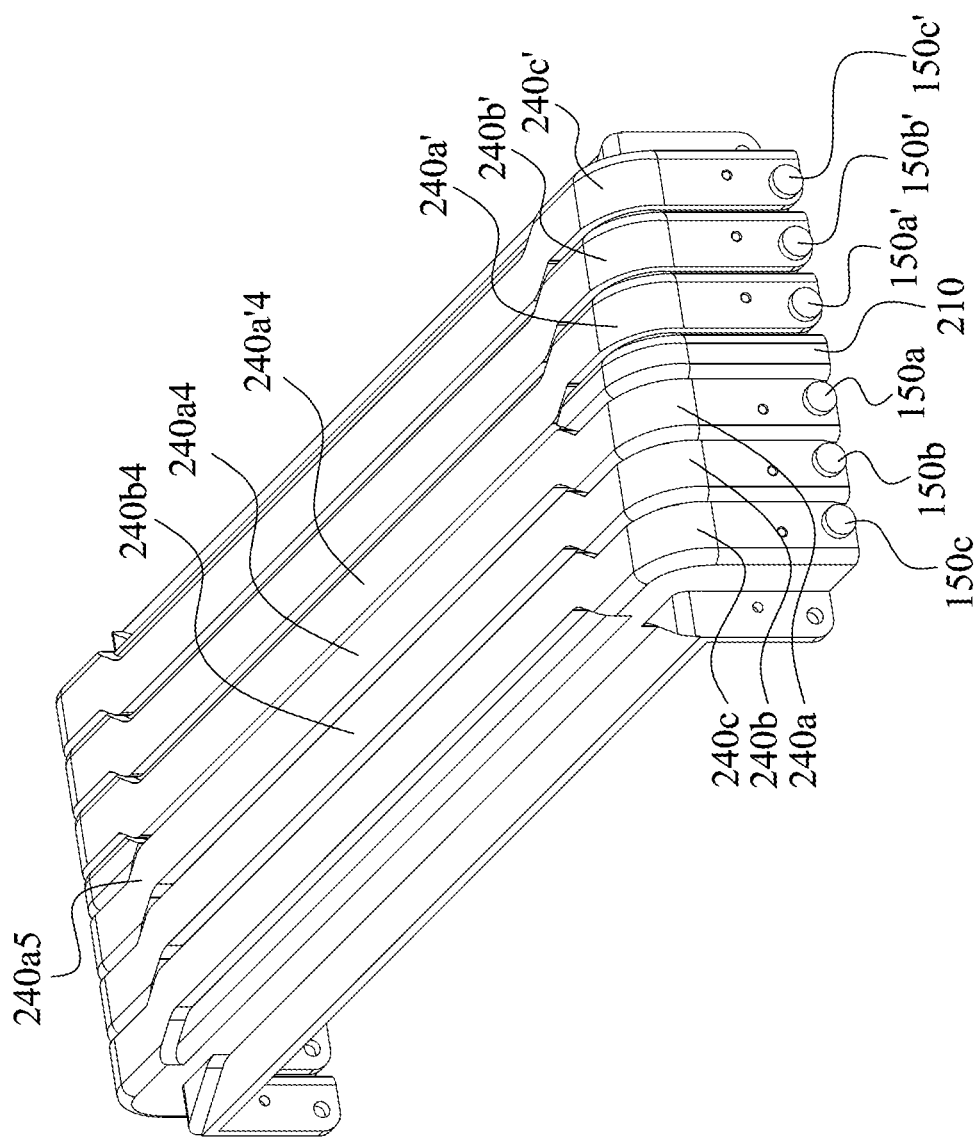
FIG. 7 is a perspective view of the bendable device in a folded state according to another embodiment of the disclosure.

Reference is made to FIGS. 6 and 7. FIG. 6 is a perspective view of a bendable device 200 in an expanded state according to another embodiment of the disclosure. FIG. 7 is a perspective view of the bendable device 200 in a folded state according to another embodiment of the disclosure. As shown in FIGS. 6 and 7, the bendable device 200 includes a base housing 210, a plurality of housings 220a, 230a, 240a, 220b, 230b, 240b, 220c, 230c, 240c, 220a', 230a', 240a', 220b', 230b', 240b', 220c', 230c', and 240c', a plurality of pivots 150a, 150b, 150c, 150a', 150b', and 150c', and a plurality of resilient members 160a1, 160a2, 160a3, 160b1, 160b2, 160b3, 160c1, 160c2, 160c3, 160a'1, 160a'2, 160a'3, 160b'1, 160b'2, 160b'3, 160c'1, 160c'2, and 160c'3, (The resilient members 160a1, 160a2, 160a3, 160b1, 160b2, 160b3, 160c1, 160c2, 160c3, 160a'1, 160a'2, 160a'3, 160b'1, 160b'2, 160b'3, 160c'1, 160c'2, and 160c'3 are covered by the housings 220a, 230a, 240a, 220b, 230b, 240b, 220c, 230c, 240c, 220a', 230a', 240a', 220b', 230b', 240b', 220c', 230c', and 240c' and therefore the marks of the resilient members 160a1, 160a2, 160a3, 160b1, 160b2, 160b3, 160c1, 160c2, 160c3, 160a'1, 160a'2, 160a'3, 160b'1, 160b'2, 160b'3, 160c'1, 160c'2, and 160c'3 are omitted in the FIGS. 6 and 7.)

The configuration of the base housing 210, the housings 220a, 230a, 240a, 220b, 230b, 240b, 220c, 230c, 240c, 220a', 230a', 240a', 220b', 230b', 240b', 220c', 230c', and 240c', the pivots 150a, 150b, 150c, 150a', 150b', and 150c', and the resilient members 160a1, 160a2, 160a3, 160b1, 160b2, 160b3, 160c1, 160c2, 160c3, 160a'1, 160a'2, 160a'3, 160b'1, 160b'2, 160b'3, 160c'1, 160c'2, and 160c'3 of the present embodiment are similar to those of the embodiments in FIGS. 1 and 2, so the introduction of the configuration of these components can refer to the previous descriptions and therefore are not repeated here to avoid duplicity. Compared with the embodiments of FIGS. 1 and 2, the base housing 210, the housing 220a, the housing 230a, the housing 240a, the housing 220b, the housing 230b, the housing 240b, the housing 220c, the housing 230c, the housing 240c, the housing 220a', the housing 230a', the housing 240a', the housing 220b', the housing 230b', the housing 240b', the housing 220c', the housing 230c', the housing 240c' of the present embodiment respectively has different design of top surfaces from the base housing 110, the housing 120a, the housing 130a, the housing 140a, the housing 120b, the housing 130b, the housing 140b, the housing 120c, the housing 130c, the housing 140c, the housing 120a', the housing 130a', the housing 140a', the housing 120b', the housing 130b', the housing 140b', the housing 120c', the housing 130c', and the housing 140c'.

Top surfaces of the housing 220a, the housing 230a, the housing 240a, the housing 220b, the housing 230b, the housing 240b, the housing 220c, the housing 230c, the housing 240c, the housing 220a', the housing 230a', the housing 240a', the housing 220b', the housing 230b', the housing 240b', the housing 220c', the housing 230c', and the housing 240c' have the same design. Therefore, the housing 240a are exemplarily described in the following. The introduction of the housings 220a, 230a, 220b, 230b, 240b, 220c, 230c, 240c, 220a', 230a', 240a', 220b', 230b', 240b', 220c', 230c', and 240c' can refer to the description of the housing 240a and therefore are not repeated in the following.

A top surface of the housing 240a includes an extension portion 240a4 and two bending portions 240a5. The two bending portions 240a5 are respectively connected to two ends of the extension portion 240a4 and the two bending portions 240a5 are symmetrically bent relative to the extension portion 240a4. As such, the two bending portions 240a5 and the extension portion 240a4 together form a groove S. When the bendable device 200 is in the folded state, an extension portion 240b4 of the adjacent housing 240b is fitted in the groove S. A top surface of the base housing 210 has two grooves S1 that are symmetrical to each other. The extension portion 240a4 of the housing 240a and an extension portion 240a'4 of the housing 240a' are respectively fitted in the two grooves S1 of the base housing 210. Therefore, when the bendable device 200 is in the folded state, the bendable device 200 would have a flush outer surface. Further, an outer surface of the bendable device 200 has a special pattern. The special pattern enhances the aesthetic appearance of the bendable device 200.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A bendable device, comprising: a base housing having two sides symmetrical to each other; a first housing pivotally connected to one of the two sides of the base housing by a first pivot; a second housing pivotally connected to the base housing and the first housing by the first pivot; a third housing pivotally connected to the base housing, the first and second housings by the first pivot; and a plurality of first resilient members respectively located between any adjacent two of the base housing, the first, second and third housings, wherein two ends of each of the plurality of the first resilient members are pivotally connected to any adjacent two of the base housing, the first, second, and third housings respectively; wherein the first, second, and third housings rotate about the first pivot relative to the base housing to have the bendable device into a folded state or an expanded state selectively; and wherein when the bendable device is in the folded state, the first, second, and third housings are sequentially stacked over one of the two sides of the base housing, such that a surface of the third housing and a surface of the base housing together form a flush outer surface.

2. The bendable device of claim 1, further comprising:
a fourth housing pivotally connected to the third housing by a second pivot;
a fifth housing pivotally connected to the third and fourth housings by the second pivot;
a sixth housing pivotally connected to the third, fourth, and fifth housings by the second pivot; and
a plurality of second resilient members respectively located between any adjacent two of the third, fourth, fifth, and sixth housings, wherein two ends of each of the second resilient members are pivotally connected to any adjacent two of the third, fourth, fifth, and sixth housings respectively.

3. The bendable device of claim 1, wherein the third housing comprising:
a cover portion;
an attachment portion adjacent to the cover portion, wherein a height of the cover portion is greater than a height of the attachment portion; and
a connected portion connected between the cover portion and the attachment portion, wherein the connected portion is arranged perpendicular to the cover portion and the attachment portion.

4. The bendable device of claim 1, further comprising a fourth housing, a fifth housing, and a sixth housing pivotally connected to the other one of the two sides of the base housing by a second pivot, wherein the fourth, fifth, sixth housings are symmetrical to the first, second, and third housings respectively.

5. The bendable device of claim 1, wherein when the bendable device is in the expanded state, joints by which the first resilient members are pivotally connected to the base housing, the first housing, the second housing, and the third housing collectively define an arc.

6. The bendable device of claim 1, wherein the first resilient members have same shape.

7. The bendable device of claim 6, wherein the first resilient members are U-shaped structures and the first pivot is located in recesses of the U-shaped structures of the first resilient members.

8. The bendable device of claim 1, wherein the first resilient members have same modulus of elasticity.

9. The bendable device of claim 1, wherein each of the first, second, and third housings comprises metal materials.

10. The bendable device of claim 1, wherein the base housing comprises:
a main portion; and
two side portions respectively connected to two sides of the main portion, wherein a top surface of the main portion and top surfaces of the side portions form a stepped structure together.

* * * * *